(12) United States Patent
Gregory

(10) Patent No.: US 8,436,338 B2
(45) Date of Patent: May 7, 2013

(54) MOLECULAR ELECTRONIC DEVICE FABRICATION METHODS AND STRUCTURES

(75) Inventor: Haydn Gregory, Cambridge (GB)

(73) Assignee: Cambridge Display Technology Limited, Cambridgeshire (GB)

(*) Notice: Subject to any disclaimer, the term of this patent is extended or adjusted under 35 U.S.C. 154(b) by 789 days.

(21) Appl. No.: 12/441,667

(22) PCT Filed: Sep. 21, 2007

(86) PCT No.: PCT/GB2007/003595
§ 371 (c)(1),
(2), (4) Date: May 21, 2009

(87) PCT Pub. No.: WO2008/035094
PCT Pub. Date: Mar. 27, 2008

(65) Prior Publication Data
US 2010/0051912 A1    Mar. 4, 2010

(30) Foreign Application Priority Data

Sep. 22, 2006 (GB) .................................. 0618698.5

(51) Int. Cl.
*H01L 29/08* (2006.01)
*H01L 35/24* (2006.01)
*H01L 51/00* (2006.01)

(52) U.S. Cl.
USPC ................. 257/40; 257/88; 257/89; 313/504; 313/505

(58) Field of Classification Search ............ 257/40, 257/88, 89; 313/504, 505
See application file for complete search history.

(56) References Cited

U.S. PATENT DOCUMENTS

| 4,539,507 A | 9/1985 | VanSlyke et al. |
| 6,878,312 B1 | 4/2005 | Kanbe et al. |

(Continued)

FOREIGN PATENT DOCUMENTS

| EP | 0 880 303 | 11/1998 |
| EP | 0 989 778 | 3/2000 |

(Continued)

OTHER PUBLICATIONS

Baldo et al., "Very High-Efficiency Green Organic Light-Emitting Devices Based on Electrophosphorescence,"*Appl. Phys. Lett.* 75(1):4-6 (1999).

(Continued)

*Primary Examiner* — Telly Green
(74) *Attorney, Agent, or Firm* — Marshall, Gerstein & Borun LLP

(57) ABSTRACT

This invention generally relates to improved methods of fabricating molecular electronic devices, in particular organic electronic devices such as organic light emitting diodes (OLEDs) by droplet deposition techniques such as ink jet printing. The invention also relates to molecular device substrates fabricated by and/or use in such methods.
We describe an optical or optoelectronic device comprising a substrate and a plurality of discrete bank structures disposed on the substrate, wherein: each bank structure defines the perimeter of at least one well; one or more of a charge transporting, charge injecting, light-filtering and light-emitting material is disposed in the well; and at least one bank structure defines the perimeter of at least one well and does not extend to the perimeter of any adjacent well. Thus in embodiments no part of said perimeter defines the bank of more than one well.

28 Claims, 9 Drawing Sheets

U.S. PATENT DOCUMENTS

| | | | |
|---|---|---|---|
| 7,132,788 B2* | 11/2006 | Gupta et al. | 313/504 |
| 8,084,767 B2* | 12/2011 | Wallace et al. | 257/40 |
| 8,115,216 B2* | 2/2012 | Smith et al. | 257/88 |
| 8,168,483 B2* | 5/2012 | Yamazaki et al. | 438/155 |
| 2005/0052120 A1 | 3/2005 | Gupta et al. | |
| 2005/0133802 A1 | 6/2005 | Lee et al. | |
| 2005/0190253 A1* | 9/2005 | Duineveld et al. | 347/106 |
| 2009/0115318 A1 | 5/2009 | Gregory et al. | |

FOREIGN PATENT DOCUMENTS

| | | |
|---|---|---|
| WO | WO-90/13148 | 11/1990 |
| WO | WO-95/06400 | 3/1995 |
| WO | WO-99/21935 | 5/1999 |
| WO | WO-99/48160 | 9/1999 |
| WO | WO-00/59267 | 10/2000 |
| WO | WO-01/16251 | 3/2001 |
| WO | WO-02/18513 | 3/2002 |
| WO | WO-02/067343 | 8/2002 |
| WO | WO-02/089211 | 11/2002 |
| WO | WO-03/065474 | 8/2003 |
| WO | WO-03/083960 | 10/2003 |
| WO | WO-2005/076386 | 8/2005 |

OTHER PUBLICATIONS

Duinevald et al., "Ink-Jet Printing of Polymer Light-Emitting Devices," *Proceedings of SPIE* vol. 4464, p. 59-67 (2002).

Reiser, "Photoreactive Polymers: The Science and Technology of Resists," *John Wiley & Sons*, p. 39 (1998).

Yang et al., "Polymer Light-Emitting Logos Processed by the Ink-Jet Printing Technology," *SPIE Photonics West: Optoelectronics*, 3279:78-86 (1998).

International Search Report and Written Opinion for Application No. PCT/GB2007/003595, dated Nov. 30, 2007.

Search Report under Section 17 for Application No. GB0618698.5, dated Jan. 25, 2007.

\* cited by examiner

LIGHT EMISSION

MOLECULAR ELECTRONIC DEVICE FABRICATION METHODS AND STRUCTURES

BACKGROUND OF THE INVENTION

1. Field of the Invention

This invention generally relates to improved methods of fabricating molecular electronic devices, in particular organic electronic devices such as organic light emitting diodes (OLEDs) by droplet deposition techniques such as ink jet printing. The invention also relates to molecular device substrates fabricated by and/or use in such methods.

2. Related Technology

Organic light emitting diodes (OLEDs) are a particularly advantageous form of electro-optic display. They are bright, colourful, fast-switching, provide a wide viewing angle and are easy and cheap to fabricate on a variety of substrates. Organic (which here includes organometallic) LEDs may be fabricated using either polymers or small molecules in a range of colours (or in multi-coloured displays), depending upon the materials used. A typical OLED device comprises two layers of organic material, one of which is a layer of light emitting material such as a light emitting polymer (LEP), oligomer or a light emitting low molecular weight material, and the other of which is a layer of a hole injecting material such as a polythiophene derivative or a polyaniline derivative.

Organic LEDs may be deposited on a substrate in a matrix of pixels to form a single or multi-colour pixellated display. A multicoloured display may be constructed using groups of red, green, and blue emitting pixels. So-called active matrix displays have a memory element, typically a storage capacitor and a transistor, associated with each pixel whilst passive matrix displays have no such memory element and instead are repetitively scanned to give the impression of a steady image.

FIG. 1 shows a vertical cross-section through an example of an OLED device 100. In an active matrix display part of the area of a pixel is occupied by associated drive circuitry (not shown in FIG. 1). The structure of the device is somewhat simplified for the purposes of illustration.

The OLED 100 comprises a substrate 102, typically 0.7 mm or 1.1 mm glass but optionally clear plastic, on which an anode layer 106 has been deposited. The anode layer typically comprises around 150 nm thickness of ITO (indium tin oxide), over which is provided a metal contact layer, typically around 500 nm of aluminium, sometimes referred to as anode metal. Glass substrates coated with ITO and contact metal may be purchased from Corning, USA. The contact metal (and optionally the ITO) is patterned as desired, and so that it does not obscure the display, by a conventional process of photolithography followed by etching.

A substantially transparent hole injection layer 108a is provided over the anode metal, followed by an electroluminescent layer 108b. Banks 112 may be formed on the substrate, for example from positive or negative photoresist material, to define wells 114 into which these active organic layers may be selectively deposited, for example by a droplet deposition or inkjet printing technique. The wells thus define light emitting areas or pixels of the display.

A cathode layer 110 is then applied by, say, physical vapour deposition. A cathode layer typically comprises a low work function metal such as calcium or barium covered with a thicker, capping layer of aluminium and optionally including an additional layer immediately adjacent the electroluminescent layer, such as a layer of lithium fluoride, for improved electron energy level matching. Mutual electrical isolation of cathode lines may achieved through the use of cathode separators (element 302 of FIG. 3b). Typically a number of displays are fabricated on a single substrate and at the end of the fabrication process the substrate is scribed, and the displays separated before an encapsulating can is attached to each to inhibit oxidation and moisture ingress.

Organic LEDs of this general type may be fabricated using a range of materials including polymers, dendrimers, and so-called small molecules, to emit over a range of wavelengths at varying drive voltages and efficiencies. Examples of polymer-based OLED materials are described in WO90/13148, WO95/06400 and WO99/48160; examples of dendrimer-based materials are described in WO 99/21935 and WO 02/067343; and examples of small molecule OLED materials are described in U.S. Pat. No. 4,539,507. The aforementioned polymers, dendrimers and small molecules emit light by radiative decay of singlet excitons (fluorescence). However, up to 75% of excitons are triplet excitons which normally undergo non-radiative decay. Electroluminescence by radiative decay of triplet excitons (phosphorescence) is disclosed in, for example, "Very high-efficiency green organic light-emitting devices based on electrophosphorescence" M. A. Baldo, S. Lamansky, P. E. Burrows, M. E. Thompson, and S. R. Forrest *Applied Physics Letters*, Vol. 75(1) pp. 4-6, Jul. 5, 1999. In the case of a polymer-based OLED layers 108 typically comprise a hole injection layer 108a and a light emitting polymer (LEP) electroluminescent layer 108b. A further hole transport layer (not shown) may be provided between hole injection layer 108a and electroluminescent layer 108b. The electroluminescent layer may comprise, for example, around 70 nm (dry) thickness of PPV (poly(p-phenylenevinylene)) and the hole injection layer, which helps match the hole energy levels of the anode layer and of the electroluminescent layer, may comprise, for example, around 50-200 nm, preferably around 150 nm (dry) thickness of PEDOT:PSS (polystyrene-sulphonate-doped polyethylene-dioxythiophene).

FIG. 2, which is taken from WO2005/076386 (hereby incorporated by reference), shows a view from above (that is, not through the substrate) of a portion of a three-colour active matrix pixellated OLED display 200 after deposition of one of the active colour layers. The figure shows an array of banks 112 and wells 114 defining pixels of the display. The wells are formed as apertures in a continuous layer or sheet.

FIG. 3a shows a view from above of a substrate 300 for inkjet printing a passive matrix OLED display. FIG. 3b shows a cross-section through the substrate of FIG. 3a along line Y-Y'.

Referring to FIGS. 3a and 3b, the substrate is provided with a plurality of cathode undercut separators 302 to separate adjacent cathode lines (which will be deposited in regions 304). A plurality of wells 308 is defined by banks 310, constructed around the perimeter of each well 308 and leaving an anode layer 306 exposed at the base of the well. The edges or faces of the banks are tapered onto the surface of the substrate as shown, heretofore at an angle of between 10 and 40 degrees. The banks present a hydrophobic surface in order that they are not wetted by the solution of deposited organic material and thus assist in containing the deposited material within a well. This is achieved by treatment of a bank material such as polyimide with an $O_2/CF_4$ plasma as disclosed in EP 0989778. Alternatively, the plasma treatment step may be avoided by use of a fluorinated material such as a fluorinated polyimide as disclosed in WO 03/083960.

As previously mentioned, the bank and separator structures may be formed from resist material, for example using a positive (or negative) resist for the banks and a negative (or positive) resist for the separators; both these resists may be based upon polyimide and spin coated onto the substrate, or a fluorinated or fluorinated-like photoresist may be employed. In the example shown the cathode separators are around 5 μm in height and approximately 20 μm wide. Banks are generally between 20 μm and 100 μm in width and in the example shown have a 4 μm taper at each edge (so that the banks are around 1 μm in height). The pixels of FIG. 3a are approximately 300 μm square but, as described later, the size of a pixel can vary considerably, depending upon the intended application.

Techniques for the deposition of material for organic light emitting diodes (OLEDs) using ink jet printing techniques are described in a number of documents including, for example, Y. Yang, "Review of Recent Progress on Polymer Electroluminescent Devices," SPIE Photonics West: Optoelectronics '98, Conf. 3279, San Jose, January, 1998; EP 0 880 303; and "Ink-Jet Printing of Polymer Light-Emitting Devices", Paul C. Duineveld, Margreet M. de Kok, Michael Buechel, Aad H. Sempel, Kees A. H. Mutsaers, Peter van de Weijer, Ivo G. J. Camps, Ton J. M. van den Biggelaar, Jan-Eric J. M. Rubingh and Eliav I. Haskal, Organic Light-Emitting Materials and Devices V, Zakya H. Kafafi, Editor, Proceedings of SPIE Vol. 4464 (2002). Ink jet techniques can be used to deposit materials for both small molecule and polymer LEDs.

A volatile solvent is generally employed to deposit a molecular electronic material (typically an organic semiconducting material), with 0.5% to 4% dissolved solvent material. This can take anything between a few seconds and a few minutes to dry and results in a relatively thin film in comparison with the initial "ink" volume. Often multiple drops are deposited, preferably before drying begins, to provide sufficient thickness of dry material. Solvents which may be used include cyclohexylbenzene and alkylated benzenes, in particular toluene or xylene; others are described in WO 00/59267, WO 01/16251 and WO 02/18513; a solvent comprising a blend of these may also be employed. Precision ink jet printers such as machines from Litrex Corporation of California, USA are used; suitable print heads are available from Xaar of Cambridge, UK and Spectra, Inc. of NH, USA.

Inkjet printing has many advantages for the deposition of materials for molecular electronic devices but there are also some drawbacks associated with the technique. As previously mentioned the photoresist banks defining the wells have until now tapered to form a shallow angle, typically around 15°, with the substrate. However it has been found that dissolved molecular electronic material deposited into a well with shallow edges dries to form a film with a relatively thin edge. FIGS. 4a and 4b illustrate this process.

FIG. 4a shows a simplified cross-section 400 through a well 308 filled with dissolved material 402 (ink), and FIG. 4b shows the same well after the material has dried to form a solid film 404. In this example the bank angle is approximately 15° and the bank height is approximately 1.5 μm. The solution 402 has a contact angle $\theta_c$ with the plasma treated bank material of typically between 30° and 40° for example around 35°; this is the angle the surface of the dissolved material 402 makes with the (bank) material it contacts, for example angle 402a in FIG. 4a. As the solvent evaporates the solution becomes more concentrated and the surface of the solution moves down the tapering face of a bank towards the substrate; pinning of the drying edge can occur at a point between the initially landed wet edge and the foot of the bank (base of the well) on the substrate ("pinning" is the point during evaporation at which the diameter d of the solution 402 remains essentially constant even though the volume V of the solution is decreasing—in other words $\Delta d/\Delta V=0$, or is very small as compared to the drop diameter). The result, shown in FIG. 4b, is that the film of dry material 404 can be very thin, for example of the order of 10 nm or less, in a region 404a where it meets the face of a bank. In practice drying is complicated by other effects such as the coffee ring—effect. With this effect because the thickness of solution is less at the edge of a drop than in the centre, as the edge dries the concentration of dissolved material there increases. Because the edge tends to be pinned solution then flows from the centre of the drop towards the edge to reduce the concentration gradient. This effect can result in dissolved material tending to be deposited in a ring rather than uniformly. The physics of the interactions of a drying solution with a surface are extremely complicated and a complete theory still awaits development.

A problem with inkjet deposition arises when filling wells which are large compared with the size of an inkjet droplet. One way around this problem is to sufficiently over fill the well such that the dissolved material is pushed into the well corners. This can be achieved by using a large number of dilute droplets and a high barrier around the well. Techniques for depositing large volumes of liquid are described in WO 03/065474 which describes the use of very high barriers (for example at page 8 lines 8 to 20) to allow the wells to hold a large volume of liquid without the liquid overflowing to adjacent wells. However such structures cannot easily be formed by photolithography and instead a plastic substrate is embossed or injection moulded.

US 2005/133802 discloses a bank structure formed by patterning a layer of a photosensitive material, wherein the bank has a structure selected so as to deal with the problem of inaccurate inkjet droplet deposition. The bank structure is designed to contain inkjet drops that are deposited between the wells rather than in the wells; the problems described above are not addressed.

We have previously described some solutions to well-filling issues (WO 05/076386, see in particular pages 6 and 7; and UK patent application no. 0605128.8 filed 15 Mar. 2006 and equivalents thereto incorporated by reference). We now describe some further advantageous techniques addressing this and related problems.

GENERAL DESCRIPTION OF THE INVENTION

According to a first aspect of the present invention there is therefore provided an optical or optoelectronic device comprising a substrate and a plurality of discrete bank structures disposed on the substrate, wherein: each bank structure defines the perimeter of at least one well; one or more of a charge transporting, charge injecting, light-filtering and light-emitting material is disposed in the well; and at least one bank structure defines the perimeter of at least one well and does not extend to the perimeter of any adjacent well.

Preferably, the material disposed in the well is provided as a layer of the light-emitting material. In this case, at least one charge transporting and/or injecting layer is also disposed in the well, in a layer separate from the layer comprising the light-emitting material.

In some preferred embodiments each of the plurality of discrete bank structures defines the perimeter of a single well. In embodiments no part of the perimeter defines the bank of more than one well.

Thus according to a related aspect of the invention there is provided a molecular electronic device structure, the structure having a plurality of wells for droplet-based deposition of molecular electronic material, the structure comprising: a substrate; a base layer supported by said substrate and defining the base of said wells; a bank over said base layer, said bank defining a perimeter of a well, and wherein no part of said perimeter defines the bank of more than one well.

In some preferred embodiments the molecular electronic material comprises light emitting material or semiconducting material. Embodiments of the bank structure can be used equally well for displays with active and passive matrix driving schemes. In other embodiments the molecular electronic material comprises light filtering material, whereby the bank structure is able to be used, for example, as a framework for patterning colour filters.

In embodiments each well has its own perimeter of bank material and therefore distinct "forbidden gaps" exist between "ring-banks" belonging to adjacent wells. In this way following droplet deposition, the solution can build up, contacting an increasing surface area of its own distinct ring-bank without impinging on the ring-bank of an adjacent well.

Further advantages associated with the ring bank arrangement of the present invention include a reduction in swathe joins in the device because ink pinning behaviour is more consistent at the drying edges of the deposited ink. Furthermore, experiments have shown that a ring bank well can accommodate around a third more volume of ink within the well when compared to a standard bank arrangement where a single and continuous bank structure is deposited to define a plurality of individual wells. Additionally, the film formed in the well of a ring-back arrangement will typically possess a thicker edge than films formed using a standard bank arrangement. This reduces or eliminates short circuits arising from contact between the cathode and the anode and/or hole injection layer arising from a thin film edge at the well periphery. Additionally, a ring bank arrangement enables a reduction in the amount of bank material required on the substrate.

The passage of the solution along the bank as the total droplet volume increases depends upon many factors. In particular it depends upon the materials and solvents employed and upon the deposition and drying conditions and can be determined by routine experiment. Further important parameters to be taken into account are the contact angle of the ink being printed and the ink drying rate (viscosity change and evaporation rate balance); other parameters include print temperature, drying temperature, drying vacuum rate, and the like and the extent of "coffee ringing".

Whereas for conventional (e.g. 1.5 micron banks) which are flat on top, the slope of the bank structure has to approximately match the contact angle of the ink, one of the advantages provided by use of the ring-bank configuration is that a variety of slopes and shapes of bank structure are applicable. The fact that the bank structure defines the perimeter of one well only means that it will necessarily have its own "downwards edge slope" unshared with another well that will always allow higher ink volume containment before overspill into the "forbidden gap". The possibility of high ink volumes provides thicker layers (that is, light emission layers and additional optional layers for charge injection, transport or blocking), good nozzle volume averaging, and swathe effect reduction in cross-pixel printing methods.

In a preferred embodiment of this aspect of the invention the bank will have a vertical thickness which tapers towards the substrate as the base of the well is approached. In such an arrangement the bank typically makes an angle with the plane defined by the base layer of from 15° to 75°, more preferably from 25° to 60° and more preferably still from 35° to 50°.

The ring-bank structure can be used to deposit a volume of ink such that the ink (ie formulation comprising a solvent and active material) brims over an inner edge of said ring-bank structure and is held by an outer edge of said ring-bank structure. The volume of solvent that may be so deposited in the ring-bank well is greater than that of a conventional well, wherein such brimming over is not possible. This higher volume in turn leads a thicker dry layer once the solvent has evaporated.

The present inventors have identified that the radius of the bank can selected to maximise the amount of ink that can be deposited into the well, in particular such that the ink brims over an inner edge of said ring-bank structure and is held by an outer edge of said ring-bank structure. Conventional prior art bank structures will typically possess a radius of around 5 micrometers. In a preferred embodiment, the ring-bank according to the present invention preferably has a radius of <0.5 µm, more preferably <0.25 µm. "Radius" as used herein means the radius of a circle having a perimeter touching (but not crossing) both the side wall surface and the upper surface of the bank. This is illustrated in FIG. 12, wherein a ring bank 122 is provided on a substrate 121. A circle 125 having radius r is described such that its perimeter is in contact with both the upper surface 123 and side-wall surface 124 of the bank 122.

A radius of <0.5 µm may be achieved by etching a layer of etchable material, or photopatterning a layer of photoresist.

In accordance with a further preferred embodiment the bank has a vertical thickness which tapers away from the substrate as the base of the well is approached. In accordance with this preferred embodiment the bank typically makes an angle with the plane defined by the base layer of from 100° to 175°, more preferably from 120° to 160° and more preferably still from 135° to 150°.

There is no need for the bank to be tapered; for example, the bank may have a uniform vertical thickness in which case the bank angle with the plane defined by the base layer will be substantially 90°.

A well may either be provided for each pixel (or colour sub-pixel) of a display or, in some display configurations, sub-pixels of each colour, for example red, blue and green, may be defined by electrodes within a channel along a row or column of the display. In this latter configuration a well may comprise such a (long, thin) channel and may therefore define a plurality of colour sub-pixels of a colour display.

In some still further embodiments, which are particularly advantageous for the fabrication of passive matrix displays, a bank support structure is provided under the banks, including apertures for the wells, to provide a layer of electrical insulation where the bank material is not present. It will be understood that this is useful where ring-banks are defined rather than mere apertures in a sheet of continuous material which would itself provide insulation. Depending upon the positioning of the banks with respect to the insulating support structure, the support structure may or may not define part of a perimeter of a well—although in general a bank will be formed over the edge of this bank support structure so that a bank edge wholly defines the edge of a well, in principle a bank may be moved inwards of an edge of the underlying support structure so that the edge of a well is partially defined by an edge of this support structure. In one embodiment, two layers of photoresist are deposited and patterned such that the underlying layer is a continuous layer comprising apertures corresponding to the well areas, and the overlying layer is patterned to form ring banks as described elsewhere in this application. As an alternative to a support structure beneath the wells, electrical insulation may also be provided by forming the ring banks on a substrate and then depositing an insulating material into the spaces between ring banks. The insulating material may be deposited selectively into the spaces between ring banks by inkjet printing, for example. Suitable insulating materials include soluble polymers such as polystyrene.

According to a further aspect of the invention there is therefore provided a molecular electronic device structure, the structure having a plurality of wells for droplet-based deposition of molecular electronic material, wherein a barrier between two adjacent said wells has a vertical cross-section with two outer edges each defining at least part of an inner edge of a respective bank around a respective one of said two adjacent wells, and two inner edges each defining at least part of an outer edge of a respective said bank around a respective one of said two adjacent wells.

In some preferred embodiments the vertical cross-section of the barrier includes a portion between the inner edges of the cross-section raised above a plane of the bases of the wells.

Preferably the banks according to any aspect of this invention are formed from photoresist and both negative and/or positive photoresist may be employed. The photoresist may be patterned by any conventional lithographic procedure, for example, using a mask or direct write technology. The photoresist may have a thickness of up to about 2 µm, preferably up to about 1 µm.

In a further related aspect the invention provides a molecular electronic device structure wherein the bank has a cross-section with a first inner edge and a second outer edge and wherein said outer edge is configured to contain said molecular electronic material during said droplet deposition.

In another related aspect the present invention provides a molecular electronic device structure including a droplet of said molecular electronic material and wherein said droplet brims over said inner edge, up to or onto said outer edge of said well-defining bank.

In a further related aspect the present invention provides a substrate for a molecular electronic device, the substrate having a plurality of ring-bank defining wells for the deposition of molecular electronic material wherein no part of each distinct ring-bank defines the perimeter of more than one well, and wherein said bank is lithographically formed from photoresist.

In another aspect the present invention provides a method for fabricating a molecular electronic device on a substrate, the method comprising depositing molecular electronic material into at least one well whose perimeter is defined by a ring-bank. Preferably, the molecular electronic material is deposited in an amount sufficient to brim over an inner edge of said ring bank structure.

In a yet further aspect the present invention provides a method for fabricating a molecular electronic device, the device including a substrate with at least one ring-bank structure defining a well, the method comprising depositing molecular electronic material dissolved in a solvent in said well such that a volume of said solvent in said well brims over an inner edge of said ring-bank structure and is held by an outer edge of said ring-bank structure.

In some preferred embodiments an inner edge of the ring-bank structure is undercut (has a "negative" angle); in other embodiments the bank has a positive profile or angle, that is tapers towards a substrate as the base of the well is approached. In still further embodiments an underlying bank support structure, for example formed of resist or some other material such as oxide or nitride, may be employed to construct a barrier between wells having a re-entrant structure (that is a structure with a concave region in its vertical cross-section), such as a trapezoid with a concave region in one of its two parallel sides. Preferably such a re-entrant structure is undercut. Embodiments of the method may include fabricating a bank structure as defined above, optionally after fabricating a bank support structure over which a bank is formed.

Preferably the molecular electronic device will comprise an organic light emitting diode-display device. The solvent in the above-described methods may then comprise an organic or apolar solvent, for example benzene based solvents, and the banks may have a hydrophobic, for example fluorinated, surface of a substrate according to an embodiment of the present invention.

BRIEF DESCRIPTION OF THE DRAWINGS

These and other aspects of the present invention will now be further described, by way of example only, with reference to the accompanying figures in which:

FIGS. 11a to 11f show, respectively, a well of a passive matrix OLED display in vertical cross-section and 3D view, and alternative examples of vertical cross-section structures for the well of FIG. 11a.

DETAILED DESCRIPTION

Figure 1:
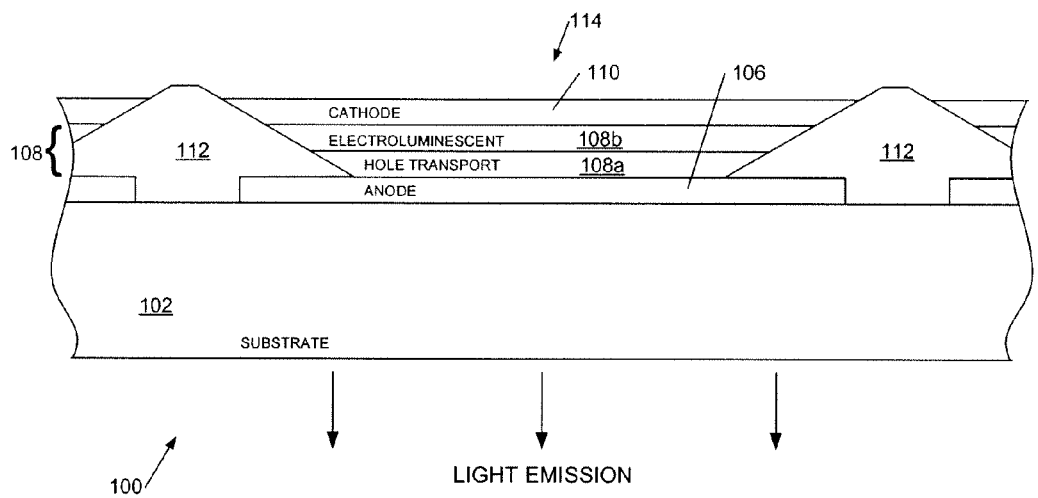
FIG. 1 shows a vertical cross-section through an example of an OLED device.
Figure 2:
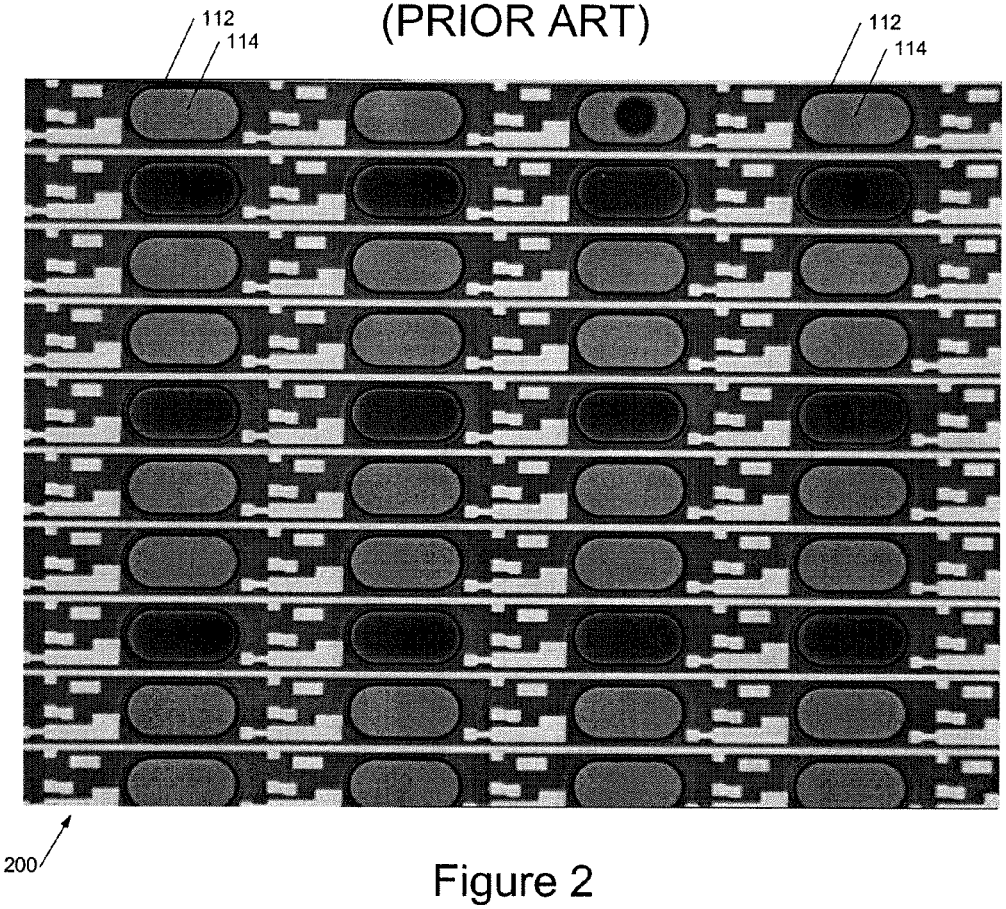
FIG. 2 shows a view from above of a portion of a three colour pixelated OLED display.
Figure 3A:
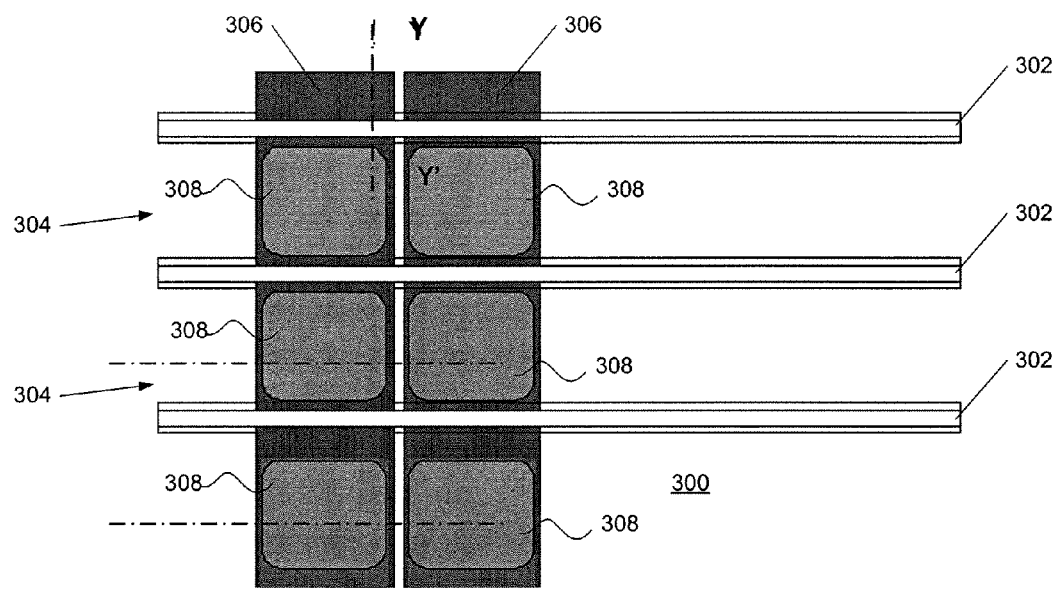
FIGS. 3a and 3b show a view from above and a cross-sectional view respectively of a passive matrix OLED display.
Figure 3B:
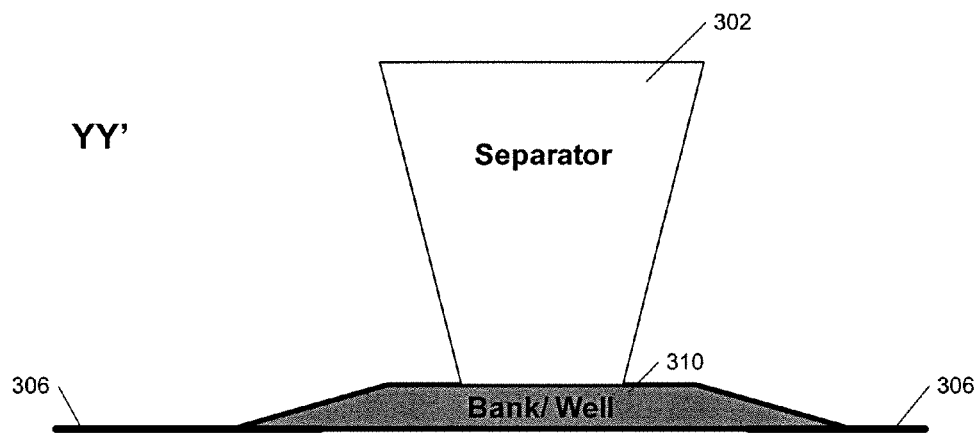
Figure 4A:
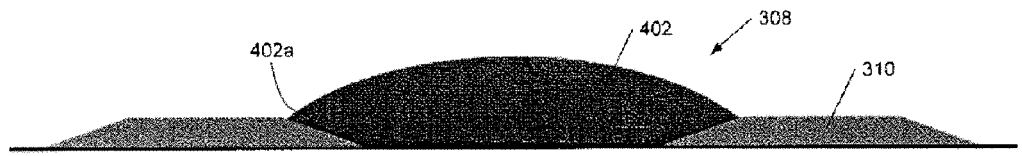
FIGS. 4a and 4b show a simplified cross-section of a well of an OLED display substrate filled with, respectively, dissolved material, and dry material.
Figure 4B:
Figure 5:
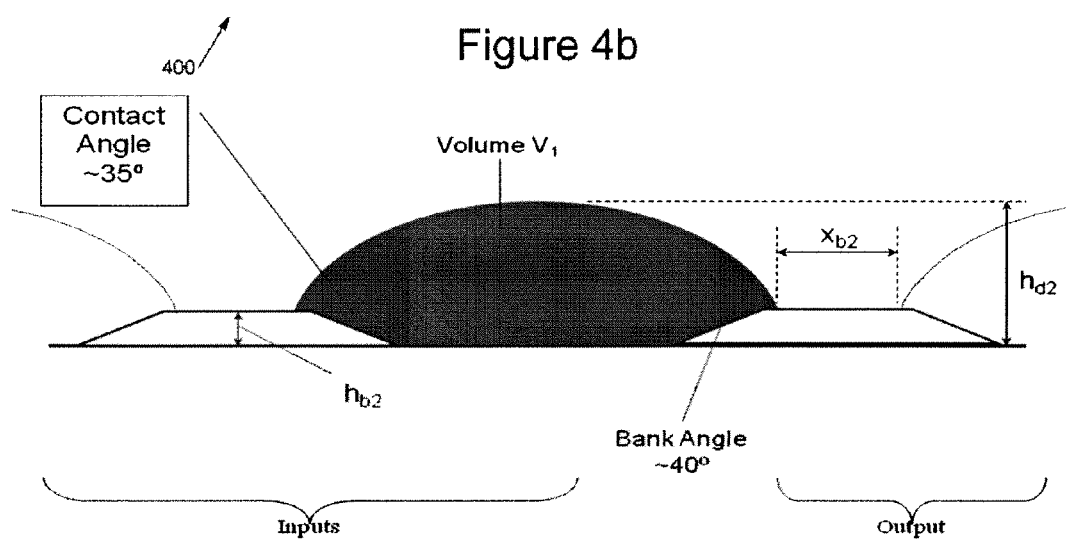
FIG. 5 illustrates a simplified vertical cross-section through a well filled with a solution of molecular electronic material.

Referring now to FIG. 5, this illustrates a well defined by banks either side which has been filled with total ink volume $V_1$ until it is brimming over the top of the well (measureable by microscopy). The banks in the figure have a height of approximately 1.5 µm, are flat on top and are common to adjacent wells, and the distance $x_{b2}$ separates the two adjacent volumes of ink in adjacent wells. The solution has a contact angle of approximately 35° with the bank material; this is the angle the surface of the dissolved material makes with the bank material it contacts. The tapered edge of the banks makes a similar bank angle, for example of approximately 40°, with the plane of the substrate. The dotted lines in the figure represent the outline of solution in adjacent wells; it can be seen that the solution volume needs to be controlled carefully to avoid reduction of the distance $x_{b2}$ to the point of coalescence of the adjacent solutions.

Figure 6:
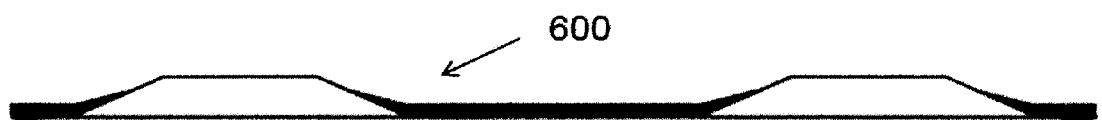
FIG. 6 illustrates the well of FIG. 5 after solvent evaporation has taken place.

FIG. 6 illustrates what happens to volume $V_1$ of FIG. 5 once solvent evaporation has taken place. The solution becomes more concentrated and the surface of the solution moves down the tapered face of the bank towards the substrate. A thin film of dry material results, with a fraction of the material drying on the tapered edges of the bank.

Figure 7:
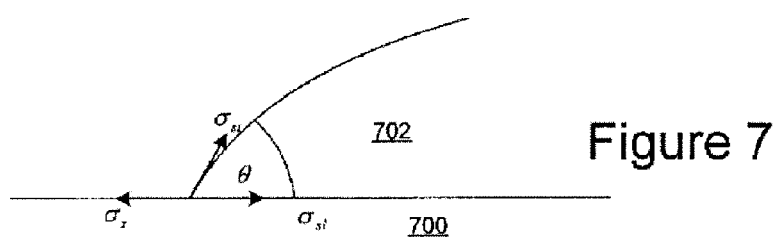
FIG. 7 illustrates surface forces for a liquid droplet on a solid surface.

FIG. 7 illustrates some of the forces which act at the edge of an interface between a solid 700 and a drop of liquid 702. The edge of the drop of liquid makes an angle $\theta$ with the surface of the solid and this angle is related to the surface tension of the liquid $\sigma_{st}$ and to the solid (-vapour) surface energy (energy per unit area) $\sigma_s$ and solid-liquid surface energy $\sigma_{sl}$ by the equation $$\sigma_{st} \cos \theta + \sigma_{sl} = \sigma_s \qquad \text{Equation 1}$$

It will be appreciated that $\theta$ may be varied if desired by varying one or more of the solvent (e.g. molecular weight or surface tension) and a solid surface treatment. For example, a bank may have a hydrophobic surface so as not to be wetted (although polar or non-polar solvents may be employed generally the solvents used have some polarity) or a hydrophilic surface, in order to be wetted. A hydrophobic surface may be achieved by treatment of a bank material such as a polyimide with an $O_2/CF_4$ plasma (as disclosed in EP 0989778) or a fluorinated material such as a fluorinated polyimide as disclosed in WO 03/083960 may be employed. The contrast angle with plasma-treated bank material is typically 30° to 40°, for example around 35°.

Figure 8A:
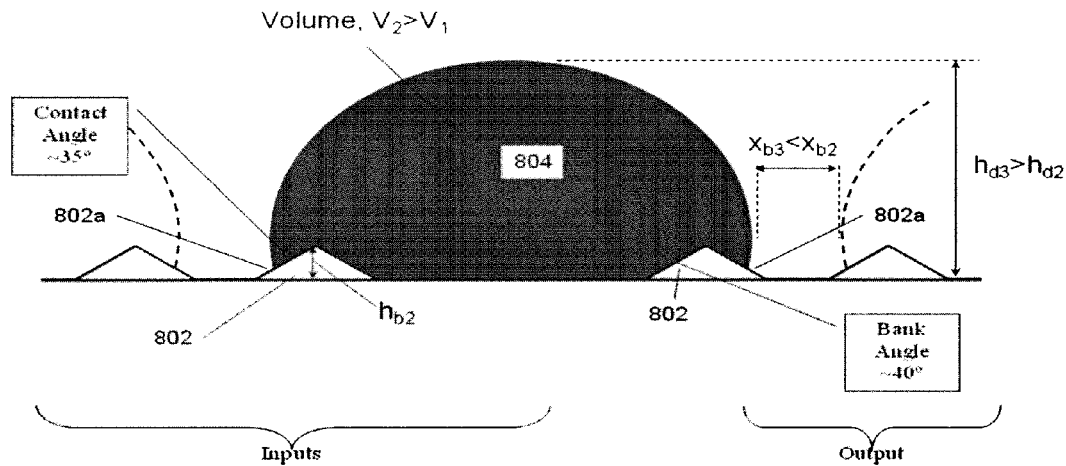
FIGS. 8a and 8b show, respectively, vertical cross-sections through first and second example embodiments of a ring-bank structure according to the invention.
Figure 8B:
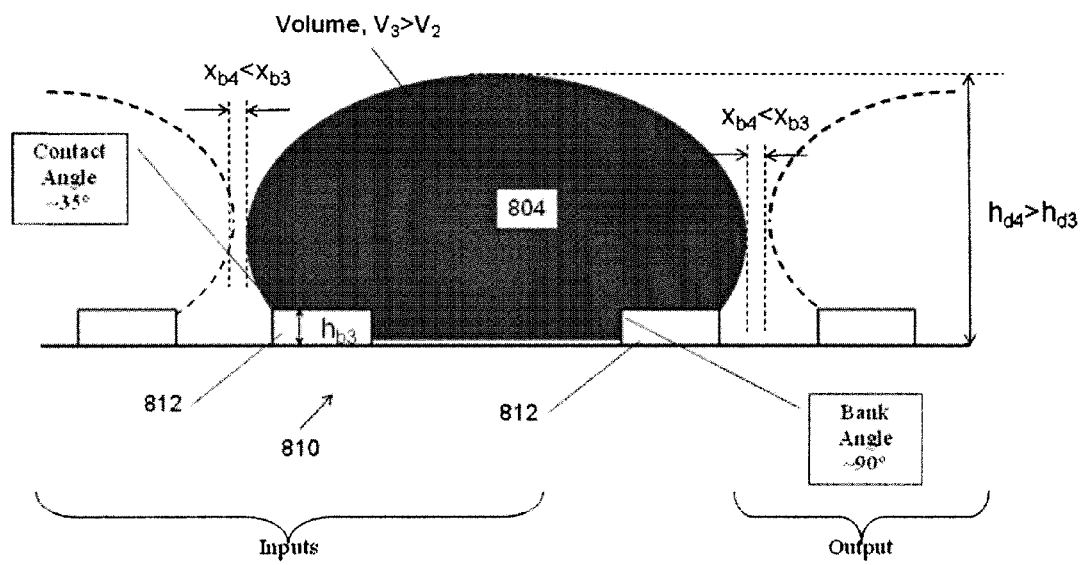

FIG. 8a illustrates a simplified vertical-cross-section through a well 800 of a substrate according to an embodiment of the present invention. The substrate includes a cross-sectional view of a ring-bank 802 with a volume $V_2$ of solution 804 held by the downwards, outer edge 802a slope of the ring-bank. In the specific embodiment illustrated the banks have a symmetrical cross-section and one in which the vertical thickness tapers towards the substrate as the base of the well is approached. The volume $V_2$ is shown as being greater than $V_1$ of FIG. 5 on account of the presence of the ring-bank, since the presence of the downwards edge slope allows higher ink volume containment before overspill into the gap between adjacent ring-banks. The contact angle of the solution with the top surface of the bank is approximately 35° and the bank angle is approximately 40°. The dotted lines represent the outlines of solutions on adjacent ring-banks and it will be noted that $x_{b3}$ is less than $x_{b2}$ of FIG. 5. FIG. 8b illustrates a further simplified vertical cross-section through a well 810 of a substrate according to a further embodiment of the present invention. Again the substrate supports ring-banks 812 this time with a uniform vertical cross-section and having a bank angle of substantially 90°. It will be seen that the volume $V_3$ has brimmed up to the outer edge of the well-defining bank. The contact angle of the solution on the bank is approximately 35° and the bank angle substantially 90°. The volume $V_3$ is indicated as being greater than the volume $V_2$ of FIG. 8a. Furthermore, the distance $x_{b4}$ is indicated as being less than $x_{b3}$.

Figure 9A:
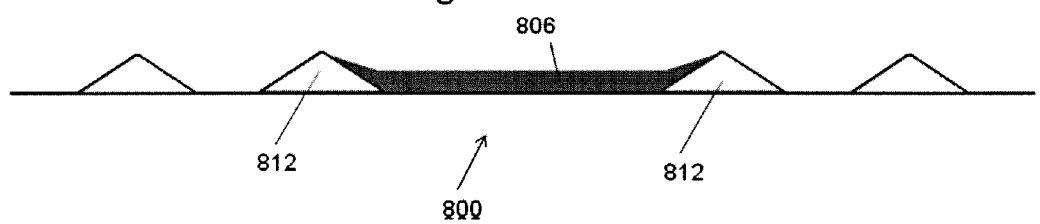
FIG. 9a shows the well of FIG. 8a after solvent evaporation.

The ring bank structures have a pinning point located on the bank. That is, as the solvent evaporates and the volume of solution contracts, the diameter of the volume of solution should essentially cease moving inwards before reaching the base of the well. This results in a film as illustrated in FIG. 9a, for example, wherein the volume $V_2$ of FIG. 8a of solution 804 has undergone evaporation leaving a dry film 806 of substantial thickness with small deposits remaining on the slopes of the banks. As described above and illustrated in FIGS. 8a and 8b, and unlike a standard bank structure, ink may brim over an inner edge of the ring-bank and in consequence may have a pinning point located outward of this inner edge—for example, at an outer edge of the ring-bank as illustrated in FIG. 8b.

For simplicity, the above Figures illustrate deposition of a single material into the well, however it will be appreciated that multiple layers may be deposited into a single layer by successive deposition and drying of corresponding inks. For example, in the case of a ring-bank structure formed on a substrate carrying an anode, one or more of a hole injection layer (such as PEDOT doped with a suitable polyacid, such as PSS or Nafion®), a hole transport layer, an electron blocking layer, a hole blocking layer and an electron transport layer may be deposited in addition to a layer of light-emitting material. In one preferred embodiment, a hole injection layer, a hole transport layer and an emissive layer are formed by printing corresponding inks into the ring-bank structure. The skilled person will be aware of methods for formation of multiple layers without dissolution of underlying layers, such as crosslinking and use of a solvent that will dissolve the material to be printed, but will not dissolve the material of the underlying layer.

Figure 9B:
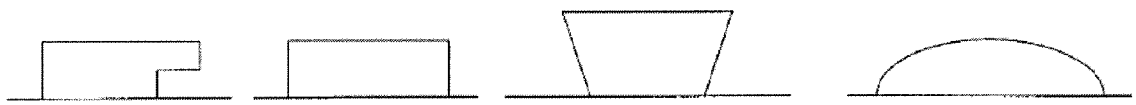
FIG. 9b illustrates example alternative bank cross-sections.

FIG. 9b illustrates a number of bank configurations in accordance with the present invention, ranging from vertical side walls to an undercut situation (including the option of an undercut shelf, which may be formed by a wet or dry isotropic etch process) to a bank structure having an approximately elliptical or semi-circular cross-section. All are capable of containing the molecular electronic material during droplet deposition.

To fabricate an undercut bank a variety of techniques may be employed. Preferably a photodefinable polymer or photoresist such as polyimide or an acrylic photoresist is lithographically patterned using a mask or reticle and then developed to produce a desired bank face angle. Either a positive or a negative photoresist may be employed (for example there are image reversal methods which may be employed to reverse an image in a positive resist). To obtain an undercut photoresist the photoresist may be under-(or over-) exposed and overdeveloped; optionally an undercut profile may be assisted by soaking in a solvent prior to development. The skilled person will be aware that there are many variations of the basic spin, expose, bake, develop, and rinse procedure used in photolithography (see, for Example, A. Reiser, *Photoreactive Polymers*, Wiley, New York, 1089, page 39, hereby incorporated by reference). Some particularly suitable resist materials are available from Zeon Corporation of Japan, who supply materials adapted for the fabrication of organic electroluminescent displays (negative resist materials in the ELX series, and positive resist materials in the WIX series).

Figure 10A:
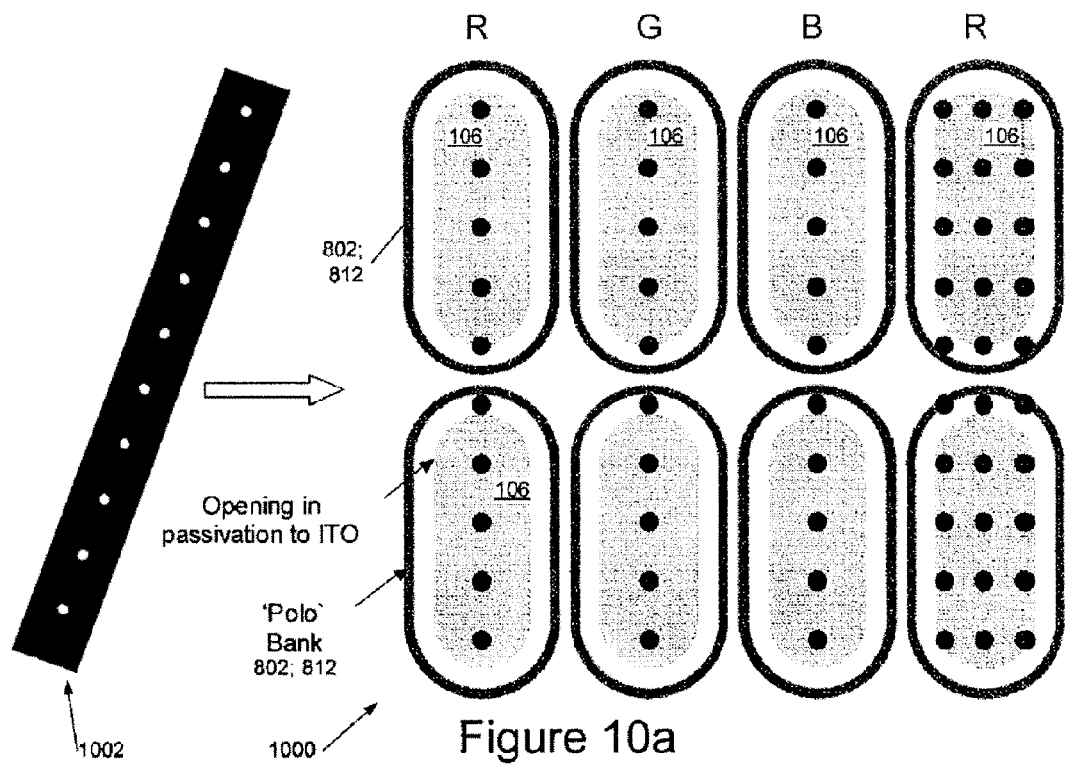
FIGS. 10 and 10b show first and second examples of ring-bank structures for a colour OLED display, and droplet-based deposition of dissolved molecular electronic material into wells formed by the structures.

FIG. 10a illustrates the passage of a sweeping head 1002 over a number of pixels of a portion of a colour OLED display 1000. The figure shows diagrammatically deposited droplets in place in those pixels and the presence of the ring-bank 802; 812. In the figure the red (R), green (G) and blue (B) sub-pixels each have a separate well with anode metal 106 at the base. Merely by way of example, in a small flat panel display a pixel may have a width of 50 µm and a length of 150 µm with, say 10 µm or 20 µm wide banks; in larger displays more suitable for applications such as a colour television a pixel width may be approximately 200 µm. In embodiments of the invention the ink volume deposited can be very substantially increased without a significant change in the pixel pitch (bank dimensions).

Figure 10B:
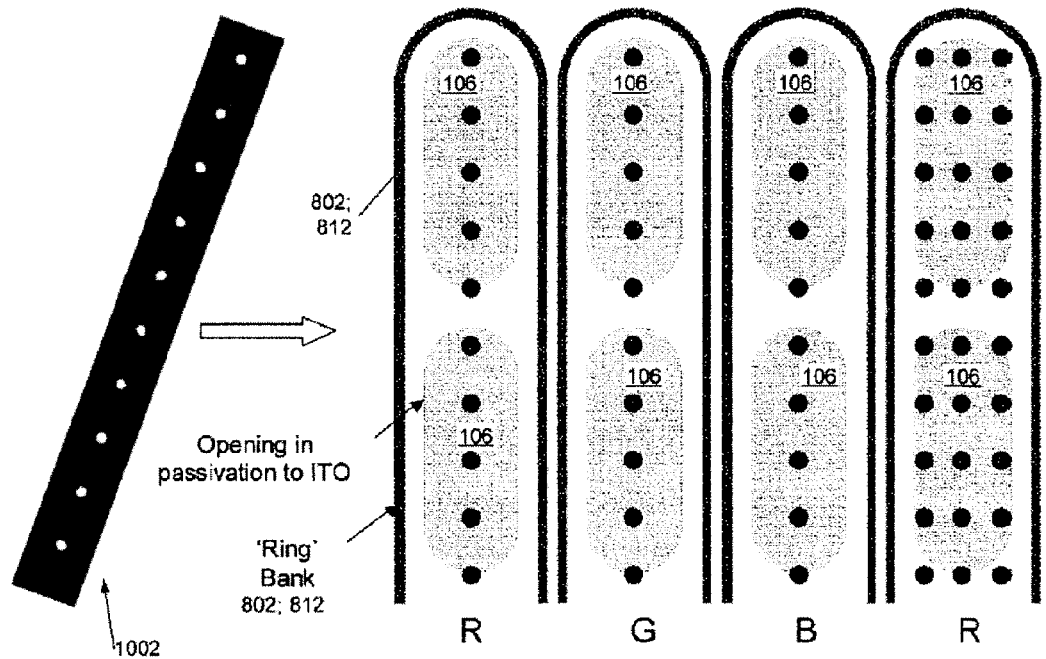

FIG. 10b illustrates an arrangement in which the ring-banks 802; 812 define longitudinal channels each holding material for a plurality of colour sub-pixels, the sub-pixels themselves being defined by anode metal 106. In embodiments the anode islands may be separated by an underlying passivation layer such as silicon oxide or nitride or SOG (spin-on-glass). Again no part of the ring-bank of one pixel is shared with another pixel.

Figure 11A:
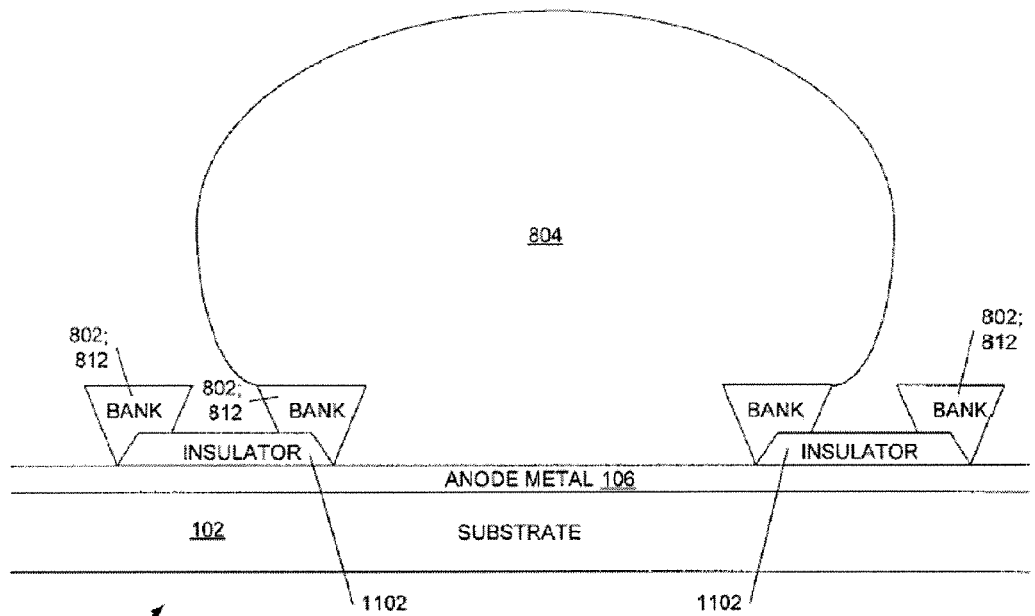
Figure 11B:
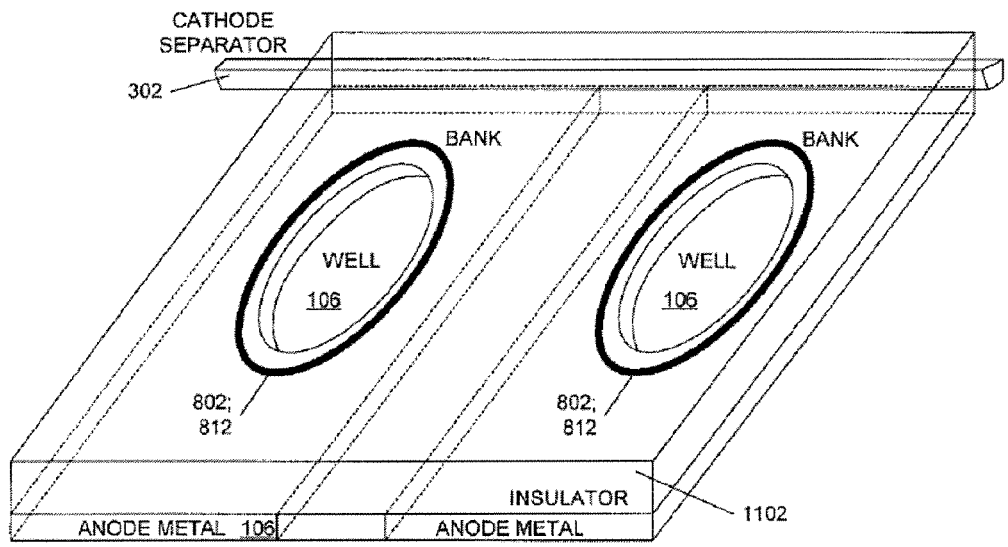
Figure 11C:
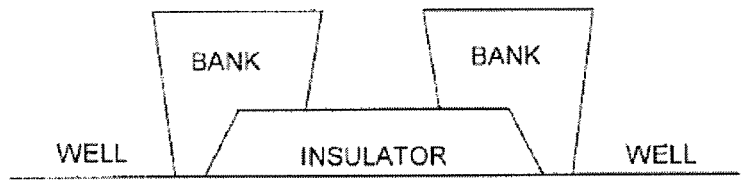
Figure 11D:
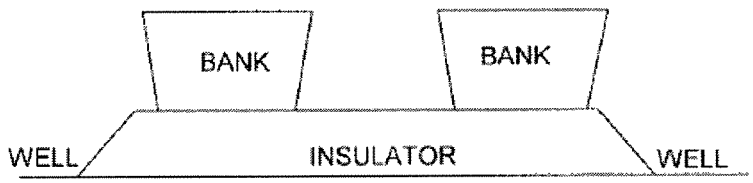
Figure 11E:
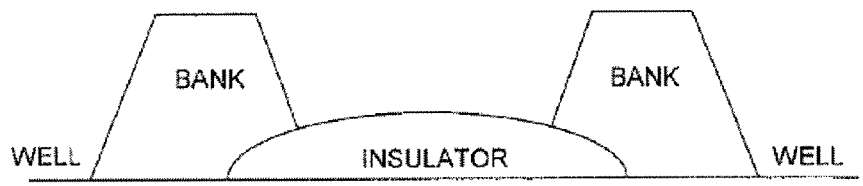
Figure 11F:
Figure 12:
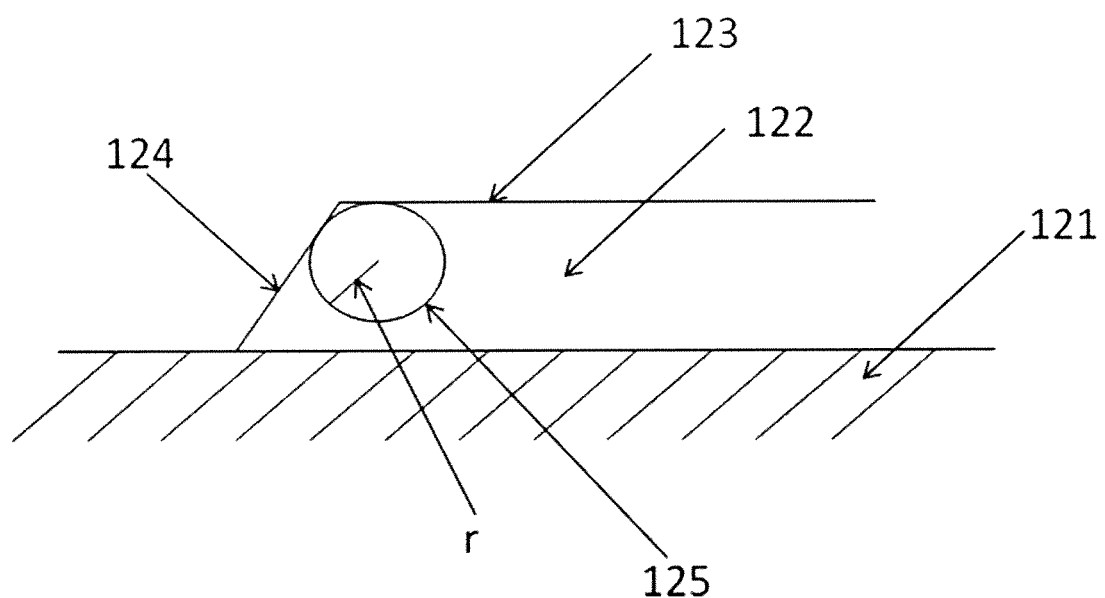
FIG. 12 is a schematic representation of an inkjet bank structure and the radius thereof.

FIG. 11a shows a cross-section through a portion of a display 1100 such as a passive matrix OLED display in which a layer of insulating material 1102 is provided over portions of the anode metal in order to insulate this from later-deposited cathode material. This is seen more clearly in FIG. 11b where it can be seen that where insulator 1102 not to be present, when cathode metal was deposited on the structure (to provide electrodes at right angles to the anode metal electrodes) the cathode and anode electrodes would short out. The insulator may comprise a conventional insulating material such as oxide, nitride or SOG or it may comprise a resist material. Where insulator 1102 comprises a resist material preferably the insulator is one of positive or negative resist, for example positive resist and the bank material is formed of the other type of resist, for example negative resist. Where insulator 1102 comprises resist material, this is preferably not fluorinated (so that the bank resist adheres well to the underlying resist). Suitable resist materials comprise the aforementioned ELX and WIX series resists from Zeon Corporation, Japan.

FIGS. 11c to 11f show some alternative configurations of a pair of ring-banks (in cross-section) in combination with underlying bank support or insulating material which may be employed.

A wide range of printable materials will be known to the skilled person. For example, the hole injection layer may be PEDOT, polyaniline or poly(thienothiophene) and derivatives thereof, and charge transport, charge blocking and emission layers may be formed from a range of known printable small molecule, polymeric and dendrimeric materials. Polymeric materials, such as homopolymers and copolymers comprising fluorene repeat units, are particularly preferred for the emission layer.

Following printing of the layers described in the examples above, fabrication of the organic light emitting diode is completed by depositing a cathode. The cathode may be transparent or opaque, for which a wide range of suitable materials and deposition techniques are known to the skilled person. For light emission through the anode side, the cathode may be opaque. However, in the case of active matrix devices in particular, it is preferred that light from the device is emitted through a transparent cathode. In this case, the anode is preferably formed from an reflective material, or is a transparent material such as ITO provided with an underlying layer of reflective material.

The organic light emitting diode is preferably encapsulated to avoid degradation caused by ingress of moisture and oxygen into the device. Suitable encapsulants include glass or metal cans, or a barrier stack comprising alternating layers of polymer and dielectric material.

The skilled person will recognised that the above described techniques are not limited to use in the fabrication of organic light emitting diodes (small molecules or polymer) but may be employed in the fabrication of any type of molecular electronic device in which material is dissolved in a solvent and deposited by a droplet deposition technique. No doubt many effective alternatives will occur to the skilled person and it will be understand that the invention is not limited to the described embodiments encompasses modifications apparent to those skilled in the art lying within the scope of the claims appended hereto.

The invention claimed is:

1. An optical or optoelectronic device comprising a substrate and a plurality of discrete bank structures disposed on the substrate, wherein:
    each bank structure defines the perimeter of at least one well;
    one or more of a charge transporting, charge injecting, light-filtering and light-emitting material is disposed in the well; and
    at least one bank structure defines the perimeter of at least one well and does not extend to the perimeter of any adjacent well,
    wherein said bank structure has a radius of <0.25 μm, where the radius means the radius of a circle having a perimeter touching but not crossing both a side wall surface and an upper surface of said bank structure.

2. An optical or optoelectronic device according to claim 1, wherein each of said plurality of discrete bank structures has a cross-section with an inner edge and an outer edge.

3. An optical or optoelectronic device according to claim 1, wherein each of said plurality of discrete bank structures defines the perimeter of a single well.

4. A molecular electronic device structure, the structure having a plurality of wells for droplet-based deposition of molecular electronic material, the structure comprising:
    a substrate; and
    a bank having a cross-section with an inner edge and an outer edge over said substrate; and
    wherein said bank defines a perimeter of a well, and wherein no part of said perimeter defines the bank of more than one well,
    wherein said bank has a radius of <0.25 μm, where the radius means the radius of a circle having a perimeter touching but not crossing both a side wall surface and an upper surface of said bank.

5. A molecular electronic device structure according to claim 4, wherein the molecular electronic material comprises light emitting material or semiconducting material.

6. A molecular electronic device structure according to claim 4, wherein the molecular electronic material comprises light filtering material.

7. A device or device structure according to claim 1, wherein the bank structure has a vertical thickness which tapers towards the substrate as the base of the well is approached.

8. A device or device structure according to claim 1, wherein the bank structure has a vertical thickness which tapers away from the substrate.

9. A device or device structure according to claim 7, wherein the bank structure is undercut to define a shelf over the substrate, said shelf defining a recess to receive the material disposed in the well.

10. A device or device structure according to claim 8, wherein the bank structure is undercut to define a shelf over the substrate, said shelf defining a recess to receive the material disposed in the well.

11. A device or device structure according to claim 7, wherein the bank structure makes an angle with the plane defined by the substrate of from 15 to 75 degrees.

12. A device or device structure according to claim 11, wherein the bank structure makes an angle with the plane defined by the base layer of from 35 to 50 degrees.

13. A device or device structure according to claim 8, wherein the bank structure makes a bank angle with the plane defined by the substrate of from 100 to 175 degrees.

14. A device or device structure according to claim 13, wherein the bank structure makes an angle with the plane defined by the substrate of from 135 to 150 degrees.

15. A device or device structure according to claim 7, wherein the bank structure comprises positive photoresist or a negative photoresist.

16. A molecular electronic device structure according to claim 4, wherein the bank has a cross-section with an inner edge and an outer edge and wherein said outer edge is configured to contain said molecular electronic material during said droplet deposition.

17. A device or device structure according to claim 7, including a droplet of well material and wherein said droplet brims over said inner edge, up to or onto said outer edge of said well-defining bank structure.

18. A molecular electronic device structure as claimed in claim 4, further comprising a bank support structure under a pair of said banks and supported by said substrate, and wherein said bank support structure defines at least part of a perimeter of two adjacent said wells.

19. A molecular electronic device structure according to claim 18, further comprising a layer of substantially electrically insulating material under said banks and supported by said substrate, wherein said wells are defined by apertures in said insulating layer; and wherein said banks are formed at least partially over said layer of substantially electrically insulating material.

20. A device or device structure according to claim 1, wherein said well defines a single pixel or colour sub-pixel of a display.

21. An OLED display device comprising the device or structure of claim 1, wherein said substrate supports a first conducting layer, and wherein the well material comprises a layer of light emitting material and a second layer of conducting material.

22. A method for fabricating a molecular electronic device on a substrate, the method comprising depositing molecular electronic material into at least one well whose perimeter is defined by a bank as defined in claim 4.

23. A method for fabricating a molecular electronic device, the device including a substrate with at least one ring-bank structure defining a well, the method comprising depositing molecular electronic material dissolved in a solvent in said well such that a volume of said solvent in said well brims over an inner edge of said ring-bank structure and is held by an outer edge of said ring-bank structure, wherein said ring-bank structure has a radius of <0.25 μm, where the radius means the radius of a circle having a perimeter touching but not crossing both a side wall surface and an upper surface of said ring-bank structure.

24. A method as claimed in claim 23, wherein said inner edge of said ring-bank structure is undercut.

25. A method as claimed in claim 23, wherein said inner edge of said ring-bank structure has a vertical thickness which tapers towards the substrate as the base of the well is approached.

26. A method as claimed in claim 23, wherein an electrically insulating layer is provided between two adjacent said ring-bank structures, partially under said ring-bank structures.

27. A method of fabricating an OLED display comprising fabricating a molecular electronic device according to a method as claimed in claim 23.

28. A molecular electronic device structure according to claim 4, wherein the bank is undercut to define a shelf over the substrate, said shelf defining a recess to receive the molecular electronic material.

* * * * *